United States Patent
Kimura et al.

(10) Patent No.: US 11,852,521 B2
(45) Date of Patent: Dec. 26, 2023

(54) VIBRATION SENSOR AND VIBRATION DETECTION DEVICE

(71) Applicant: Mitsubishi Electric Corporation, Tokyo (JP)

(72) Inventors: Tomonori Kimura, Tokyo (JP); Rokuzo Hara, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 127 days.

(21) Appl. No.: 17/473,002

(22) Filed: Sep. 13, 2021

(65) Prior Publication Data
US 2021/0404866 A1 Dec. 30, 2021

Related U.S. Application Data

(63) Continuation of application No. PCT/JP2019/016311, filed on Apr. 16, 2019.

(51) Int. Cl.
*G01H 11/08* (2006.01)
*G01L 1/16* (2006.01)
*H10N 30/30* (2023.01)

(52) U.S. Cl.
CPC .............. *G01H 11/08* (2013.01); *G01L 1/167* (2013.01); *H10N 30/302* (2023.02)

(58) Field of Classification Search
CPC ....... G01H 11/08; G01L 1/167; H10N 30/302
See application file for complete search history.

(56) References Cited

U.S. PATENT DOCUMENTS 6,366,675 B1 4/2002 Toda
8,525,619 B1 * 9/2013 Olsson ............... H03H 9/02228
333/187

FOREIGN PATENT DOCUMENTS

| JP | 2000-329612 A | 11/2000 |
| JP | 2013-57627 A | 3/2013 |
| JP | 2017-187421 A | 10/2017 |
| JP | 2017187420 A | * 10/2017 |
| JP | 2017187421 A | * 10/2017 |

OTHER PUBLICATIONS

German Office Action for German Application No. 11 2019 007 003.7, dated Feb. 18, 2022, with English translation.

* cited by examiner

*Primary Examiner* — Peter J Macchiarolo
*Assistant Examiner* — John M Royston
(74) *Attorney, Agent, or Firm* — Birch, Stewart, Kolasch & Birch, LLP

(57) ABSTRACT

Disclosed is a vibration sensor including a piezoelectric substrate, a first electrode and a second electrode that are arranged on the piezoelectric substrate, an amplifier electrically connected between the first electrode and the second electrode, and a solid medium having a first surface part in contact with the piezoelectric substrate, and a second surface part disposed opposite to the first surface part and used for contact with a target substance, the solid medium having a sound speed lower than the phase speed of a plate wave in the piezoelectric substrate, in which an oscillation loop includes the piezoelectric substrate, the first electrode, the second electrode, the amplifier, and the solid medium, and a vibration of the target substance is detected as a result of variation in the loop length of the oscillation loop in response to the vibration of the target substance.

11 Claims, 6 Drawing Sheets

VIBRATION SENSOR AND VIBRATION DETECTION DEVICE

CROSS REFERENCE TO RELATED APPLICATIONS

This application is a Continuation of PCT International Application No. PCT/JP2019/016311, filed on Apr. 16, 2019, all of which is hereby expressly incorporated by reference into the present application.

TECHNICAL FIELD

The present invention relates to a vibration sensor and a vibration detection device.

BACKGROUND ART

Conventionally, a type of vibration sensors that detect vibrations using a piezoelectric element have been developed. Further, a type of vibration sensors that use a piezoelectric substrate and a medium used for ultrasonic wave propagation, thereby detecting a vibration on the basis of a variation in the length of a propagation path of an ultrasonic wave in the medium, have been also developed (for example, refer to Patent Literature 1).

CITATION LIST

Patent Literature

Patent Literature 1: JP 2000-329612 A

SUMMARY OF INVENTION

Technical Problem

Conventional vibration sensors described in Patent Literature 1 and so on use liquid as the medium used for ultrasonic wave propagation. Therefore, a problem is that the characteristics of vibration sensors greatly change dependently on the temperature of the liquid, the amount of the liquid, and so on. A further problem is that there is a necessity to dispose a structure for preventing a leak of the liquid.

The present invention is made in order to solve the above-mentioned problems, and it is therefore an object of the present invention to provide a technique of eliminating the necessity of a liquid medium in a type of vibration sensor and vibration detection device that detect a vibration on the basis of a variation of the length of a propagation path of an ultrasonic wave in a medium.

Solution to Problem

According to the present invention, there is provided a vibration sensor including: a piezoelectric substrate; a first electrode and a second electrode that are arranged on the piezoelectric substrate; an amplifier electrically connected between the first electrode and the second electrode; and a solid medium having a first surface part in contact with the piezoelectric substrate, and a second surface part disposed opposite to the first surface part and used for contact with a target substance, the solid medium having a sound speed lower than a phase speed of a plate wave in the piezoelectric substrate, in which an oscillation loop includes the piezoelectric substrate, the first electrode, the second electrode, the amplifier, and the solid medium, and a vibration of the target substance is detected as a result of variation in the loop length of the oscillation loop in response to the vibration of the target substance.

Advantageous Effects of Invention

According to the present invention, because it is configured as above, the necessity of a liquid medium can be eliminated.

DESCRIPTION OF EMBODIMENTS

Hereinafter, in order to explain the present invention in greater detail, embodiments of the present invention will be described with reference to the accompanying drawings.

Embodiment 1

Figure 1:
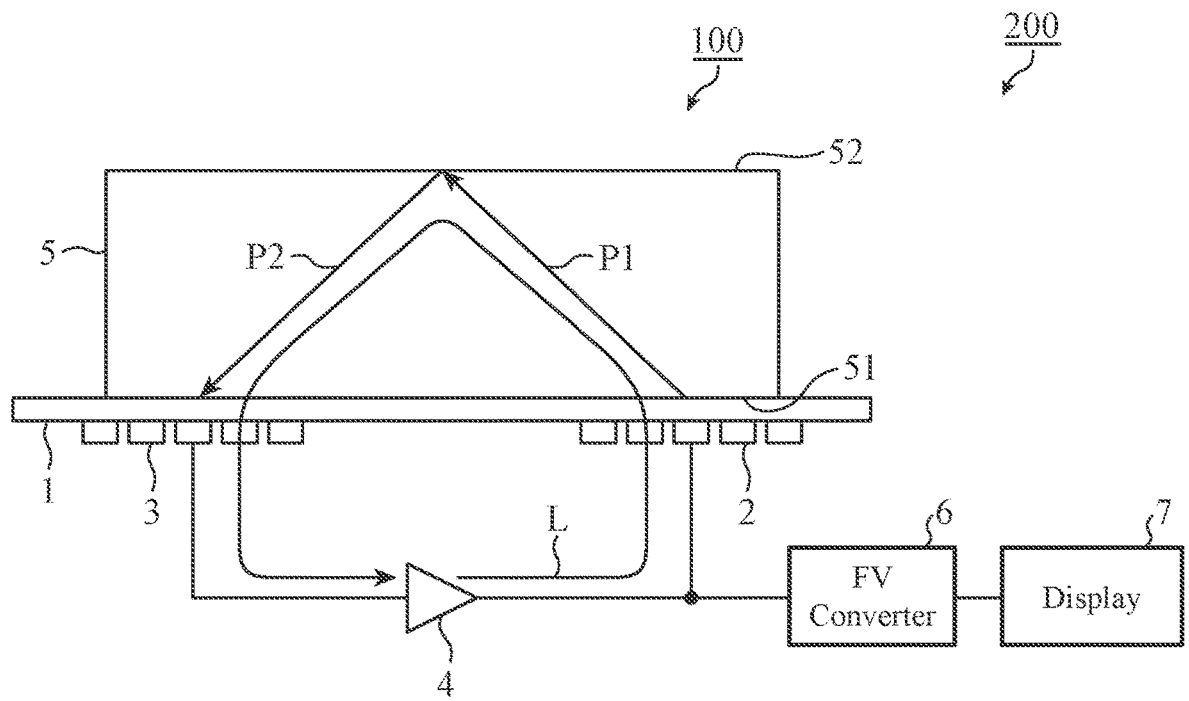
FIG. 1 is an explanatory drawing showing a main part of a vibration detection device including a vibration sensor according to Embodiment 1.

FIG. 1 is an explanatory drawing showing a main part of a vibration detection device including a vibration sensor according to Embodiment 1. The vibration detection device including the vibration sensor according to Embodiment 1 will be explained by reference to FIG. 1.

In the figure, reference numeral 1 denotes a piezoelectric substrate. An interdigital electrode (referred to as a "first electrode" hereinafter) 2 used for input of an electric signal is disposed on a surface part of the piezoelectric substrate 1. Further, an interdigital electrode (referred to as a "second electrode" hereinafter) 3 used for output of an electric signal is disposed on the surface part of the piezoelectric substrate 1. An amplifier 4 is electrically connected between the first electrode 2 and the second electrode 3.

Hereinafter, a direction extending along a plate surface of the piezoelectric substrate 1 may be referred to as a "horizontal direction." Further, a direction orthogonal to the plate surface of the piezoelectric substrate 1 may be referred to as a "vertical direction."

In the figure, reference numeral 5 denotes a solid medium. The solid medium 5 has a pair of surface parts 51 and 52 arranged opposite to each other. One surface part (referred to as a "first surface part" hereinafter) 51 of the pair of surface parts 51 and 52 is in contact with a rear surface part of the piezoelectric substrate 1. The other surface part (referred to as a "second surface part" hereinafter) 52 of the pair of surface parts 51 and 52 is used for contact with a substance which is a target for detection of vibrations by the vibration sensor 100 (referred to as a "target substance" hereinafter). The target substance is, for example, a solid substance, a liquid substance, or a gas substance.

A main part of the vibration sensor 100 is constituted by the piezoelectric substrate 1, the first electrode 2, the second electrode 3, the amplifier 4, and the solid medium 5. More specifically, the vibration sensor 100 can be used for detection of vibrations in various pieces of equipment. Further, the vibration sensor 100 can be used for detection of vibrations in various materials.

Here, a so-called "oscillation loop" (L in the figure) is constituted by the piezoelectric substrate 1, the first electrode 2, the second electrode 3, the amplifier 4, and the solid medium 5. The oscillation loop L includes the amplifier 4. Further, the oscillation loop L includes a part (i.e., the piezoelectric substrate 1) through which a plate wave propagates, a part (i.e., the first electrode 2, the second electrode 3, the amplifier 4, etc.) through which an electric signal propagates, and a part (i.e., the solid medium 5) through which an ultrasonic wave propagates.

Input of an electric signal to the first electrode 2 causes a plate wave propagating through the piezoelectric substrate 1 to be generated. More concretely, a so-called "Lamb wave" is generated. The solid medium 5 is made of a material having a sound speed lower than the phase speed of the plate wave propagating through the piezoelectric substrate 1. Therefore, a leak of the energy of the generated plate wave into the solid medium 5 causes an ultrasonic wave (referred to as a "first ultrasonic wave" hereinafter) propagating through the solid medium 5 to be generated. In the figure, P1 shows an example of the propagation path of the first ultrasonic wave.

Reflection of the first ultrasonic wave by the second surface part 52 causes an ultrasonic wave (referred to as a "second ultrasonic wave" hereinafter) propagating through the solid medium 5 to be generated. In the figure, P2 shows an example of the propagation path of the second ultrasonic wave. When the second ultrasonic wave reaches the piezoelectric substrate 1, a plate wave propagating through the piezoelectric substrate 1 is generated. The second electrode 3 outputs an electric signal corresponding to the generated plate wave to the amplifier 4. As mentioned above, the amplifier 4 is electrically connected between the first electrode 2 and the second electrode 3. Therefore, when the amplification factor in the amplifier 4 exceeds a predetermined value, the oscillation loop L oscillates.

The oscillating frequency (simply referred to as the "frequency" hereinafter) F in the oscillation loop L has a value different dependently on the loop length of the oscillation loop L (referred to as the "oscillation loop length" hereinafter). More specifically, the frequency F gradually becomes lower with increase in the oscillation loop length. In other words, the frequency F gradually becomes higher with decrease in the oscillation loop length. As shown in FIG. 1, a major part of the oscillation loop length is the lengths of the propagation paths of the first and second ultrasonic waves. More specifically, the major part of the oscillation loop length is the lengths of the propagation paths P1 and P2 in the solid medium 5.

A frequency-to-voltage converter (referred to as an "FV converter" hereinafter) 6 converts the frequency F into a voltage V. A display 7 displays a screen including a waveform showing the voltage V with respect to time (referred to as a "voltage waveform" hereinafter). The display 7 is constituted by, for example, a liquid crystal display or an organic electro luminescence (EL) display.

The main part of the vibration detection device 200 is constituted by the vibration sensor 100, the FV converter 6, and the display 7.

Next, a method of detecting a vibration by the vibration detection device 200 will be explained by reference to FIG. 2. More concretely, a method of detecting a vibration including at least a vibration component in a vertical direction (referred to as a "vertical vibration" hereinafter) will be explained. In addition, a use of the vibration detection device 200 will be explained.

Figure 2A:
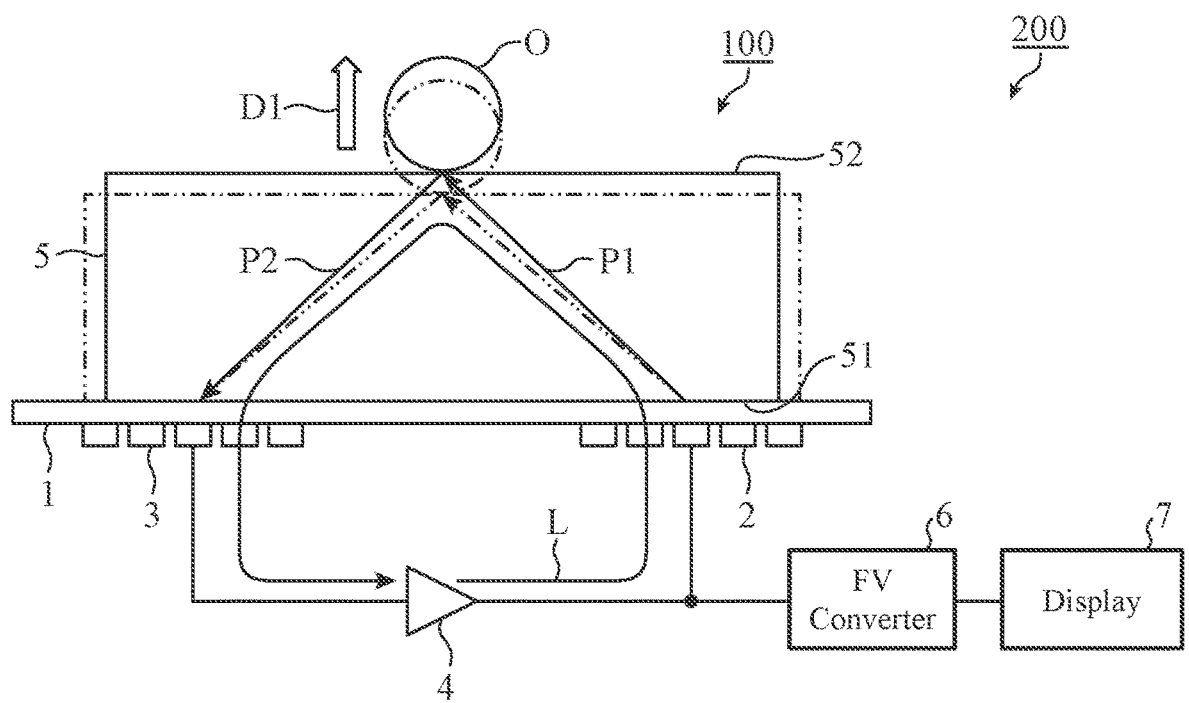
FIG. 2A is an explanatory drawing showing an example of a state in which the length of an oscillation loop varies as a result of deformation of a solid medium in response to a vertical vibration of a target substance.
Figure 2B:
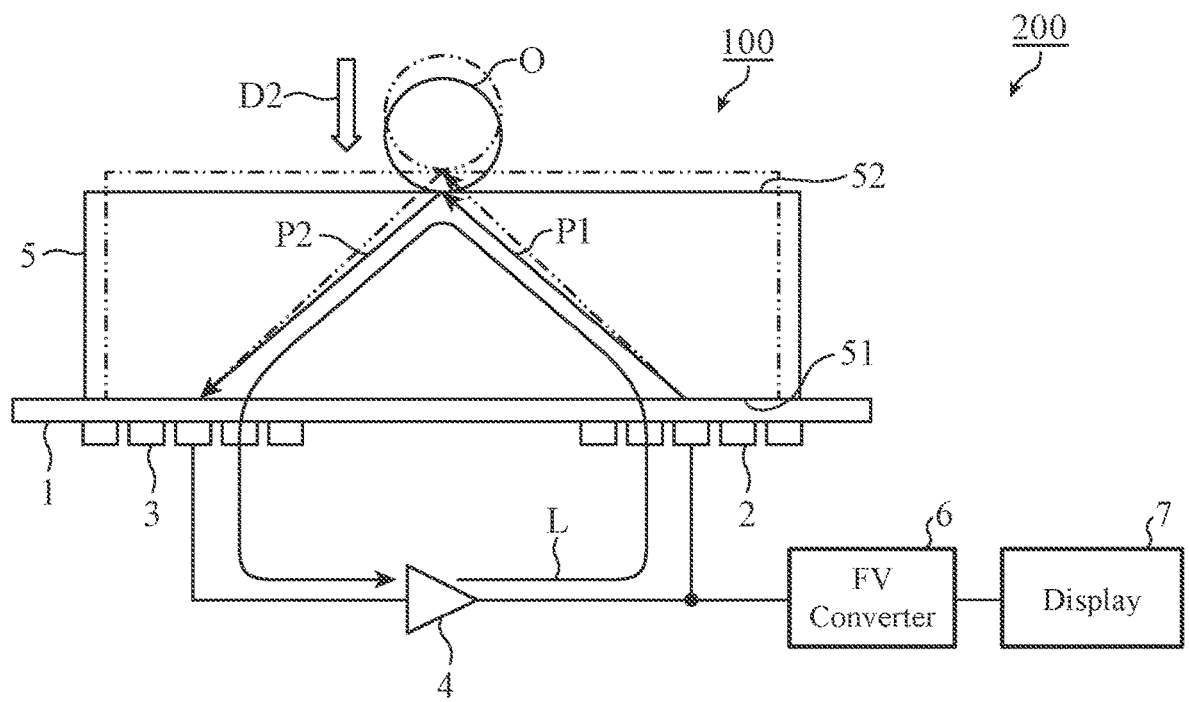
FIG. 2B is an explanatory drawing showing an example of the state in which the oscillation loop length varies as a result of deformation of the solid medium in response to a vertical vibration of the target substance.

As shown in FIG. 2, the solid medium 5 becomes deformed as a result of vibration of the target substance O in a vertical direction, in a state in which the target substance O is in contact with the second surface part 52 of the solid medium 5. In the figure, D1 and D2 denote the movement directions of the target substance O caused by the vertical vibration. More specifically, D1 and D2 denote the vibration directions of the target substance O.

The deformation of the solid medium 5 causes the path lengths of the propagation paths P1 and P2 to vary. The variations of the path lengths of the propagation paths P1 and P2 cause the oscillation loop length to vary. The variation of the oscillation loop length causes the frequency F to vary. The variation of the frequency F causes the voltage V to vary. Therefore, the user of the vibration detection device 200 can visually recognize the vertical vibration of the target substance O by viewing the voltage waveform displayed on the display 7. In this way, the vibration detection device 200 can detect the vertical vibration of the target substance O.

For example, in the case where the target substance O is part of equipment, the user can use a detection result provided by the vibration detection device 200, for determination of the necessity or unnecessity of maintenance work on the equipment. More specifically, the user compares a vibrational state when the equipment is in a normal state and the vibrational state shown by the detection result provided by the vibration detection device 200. As a result, the user determines whether the equipment is in either the normal state or an abnormal state. When it is determined that the equipment is in an abnormal state, the user determines that it is necessary to perform the maintenance work on the equipment.

In contrast, when it is determined that the equipment is in the normal state, the user determines that it is unnecessary to perform the maintenance work on the equipment. As a result, unnecessary maintenance work can be prevented from being performed. As a result, the maintenance cost of the equipment can be reduced.

Next, the material of the solid medium 5 will be explained.

The vibration sensor 100 uses the solid medium 5. In order to allow the energy of the plate wave propagating through the piezoelectric substrate 1 to leak into the solid medium 5, it is required that the sound speed in the solid medium 5 is lower than the phase speed of the plate wave. Although the phase speed of the plate wave differs dependently on the frequency F, the thickness of the piezoelectric substrate 1, the material of the piezoelectric substrate 1, etc., the phase speed is substantially equal to or greater than 1,500 meters per second (described as "m/s" hereinafter). For example, the phase speed of the plate wave is 2,600 m/s.

Here, conventional vibration sensors use a liquid medium instead of the solid medium 5. Generally, the sound speed in liquid is low compared with the sound speed in solid. For example, the sound speed in the water is approximately 1,500 m/s. One reason that a liquid medium is used in conventional vibration sensors is that a leak of the energy of the plate wave into the medium is facilitated by reducing the sound speed in the medium.

In other words, generally, the sound speed in solid is high compared with the sound speed in liquid. For example, the sound speed of a longitudinal wave in steel is approximately 5,930 m/s. Therefore, in a case where the phase speed of the plate wave propagating through the piezoelectric substrate 1 is 2, 600 m/s, and the solid medium 5 is made of steel, the energy of the plate wave does not leak into the solid medium 5. As a result, because the oscillation loop L does not oscillate, no vibration of the target substance is detected.

In contrast with this, for example, the sound speed of a longitudinal wave in polysulfone is approximately 2,260 m/s. Therefore, in the case where the phase speed of the plate wave propagating through the piezoelectric substrate 1 is 2,600 m/s, and the solid medium 5 is made of polysulfone, the energy of the plate wave leaks into the solid medium 5. As a result, because the oscillation loop L oscillates, a vibration of the target substance is detected.

More specifically, because the solid medium 5 is made of a material having a sound speed lower than the phase speed of the plate wave propagating through the piezoelectric substrate 1, the vibration sensor 100 performs its essential functions.

Next, experimental results of the voltage waveform in the case of using the solid medium 5 made of polysulfone will be explained by reference to FIG. 3.

Figure 3A:
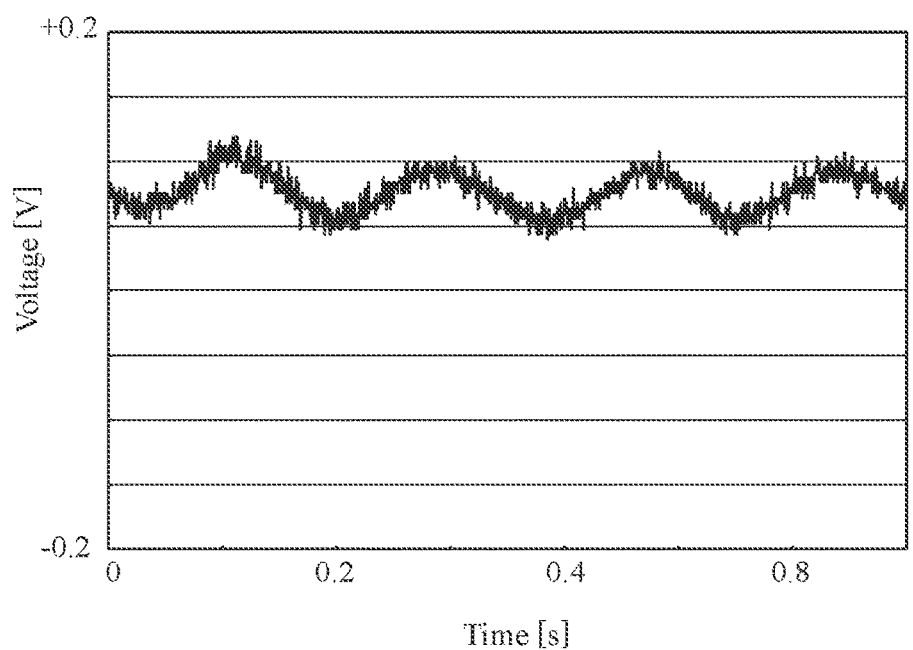
FIG. 3A is a characteristic diagram showing an experimental result of a voltage waveform when a load is intermittently imposed on a second surface part of the solid medium.
Figure 3B:
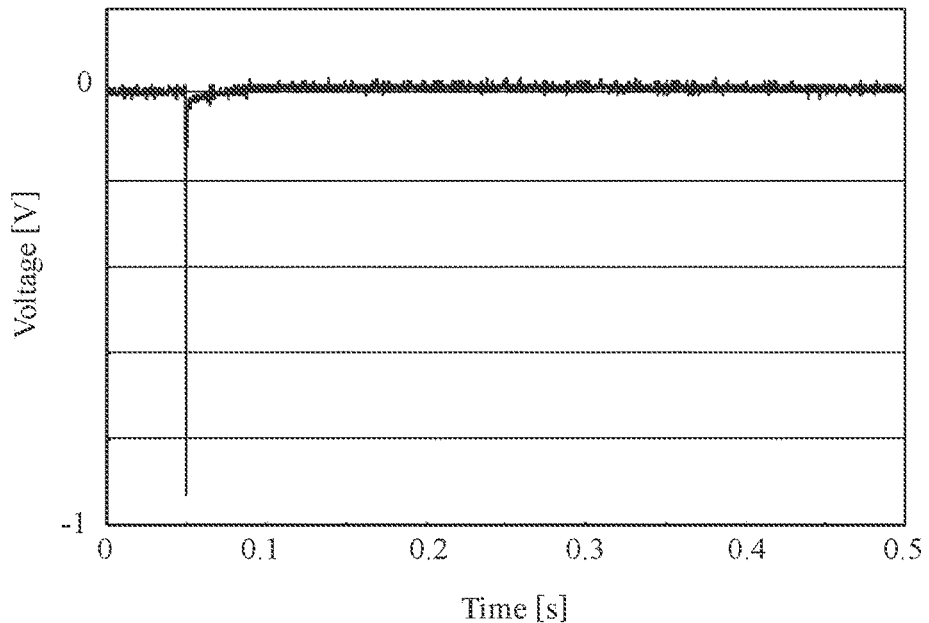
FIG. 3B is a characteristic diagram showing an experimental result of the voltage waveform when a load is instantaneously imposed on the second surface part of the solid medium.

FIG. 3A shows an experimental result of the voltage waveform when a load is intermittently imposed on the second surface part 52 of the solid medium 5 made of polysulfone. As shown in FIG. 3A, when a load is intermittently imposed on the second surface part 52, a sinusoidal-like voltage waveform is displayed on the display 7. Further, FIG. 3B shows an experimental result of the voltage waveform when a load is instantaneously imposed on the second surface part 52 of the solid medium 5 made of polysulfone. As shown in FIG. 3B, when a load is instantaneously imposed on the second surface part 52, a spike shaped voltage waveform is displayed on the display 7. It can be seen from these results that the vibration sensor 100 performs its essential functions.

The material of the solid medium 5 is not limited to polysulfone. As mentioned above, the material of the solid medium 5 only needs to have a sound speed lower than the phase speed of the plate wave propagating through the piezoelectric substrate 1.

Further, for example, a member for allowing the solid medium 5 to adhere to the piezoelectric substrate 1 may be disposed between the rear surface part of the piezoelectric substrate 1 and the first surface part 51 of the solid medium 5. More specifically, the contact of the first surface part 51 with the piezoelectric substrate 1 may be either direct contact not via such a member, or indirect contact via such a member.

Further, for example, a member for covering may be disposed on a part of the solid medium 5 including at least the second surface part 52. More specifically, the contact of the second surface part 52 with the target substance may be either direct contact not via such a member, or indirect contact via such a member.

As mentioned above, the vibration sensor 100 of Embodiment 1 includes: the piezoelectric substrate 1; the first electrode 2 and the second electrode 3 that are arranged on the piezoelectric substrate 1; the amplifier 4 electrically connected between the first electrode 2 and the second electrode 3; and the solid medium 5 having the first surface part 51 in contact with the piezoelectric substrate 1, and the second surface part 52 disposed opposite to the first surface part 51 and used for contact with the target substance, and having a sound speed lower than the phase speed of the plate wave in the piezoelectric substrate 1, and the oscillation loop L includes the piezoelectric substrate 1, the first electrode 2, the second electrode 3, the amplifier 4, and the solid medium 5, and a vibration of the target substance is detected as a result of variation in the loop length (oscillation loop length) of the oscillation loop L in response to the vibration of the target substance. As a result, it is possible to eliminate the necessity of a liquid medium.

Further, the loop length (oscillation loop length) varies as a result of deformation of the solid medium 5 in response to a vertical vibration of the target substance. As a result, a vertical vibration of the target substance can be detected on the basis of a variation of the oscillation loop length.

Embodiment 2

Figure 4:
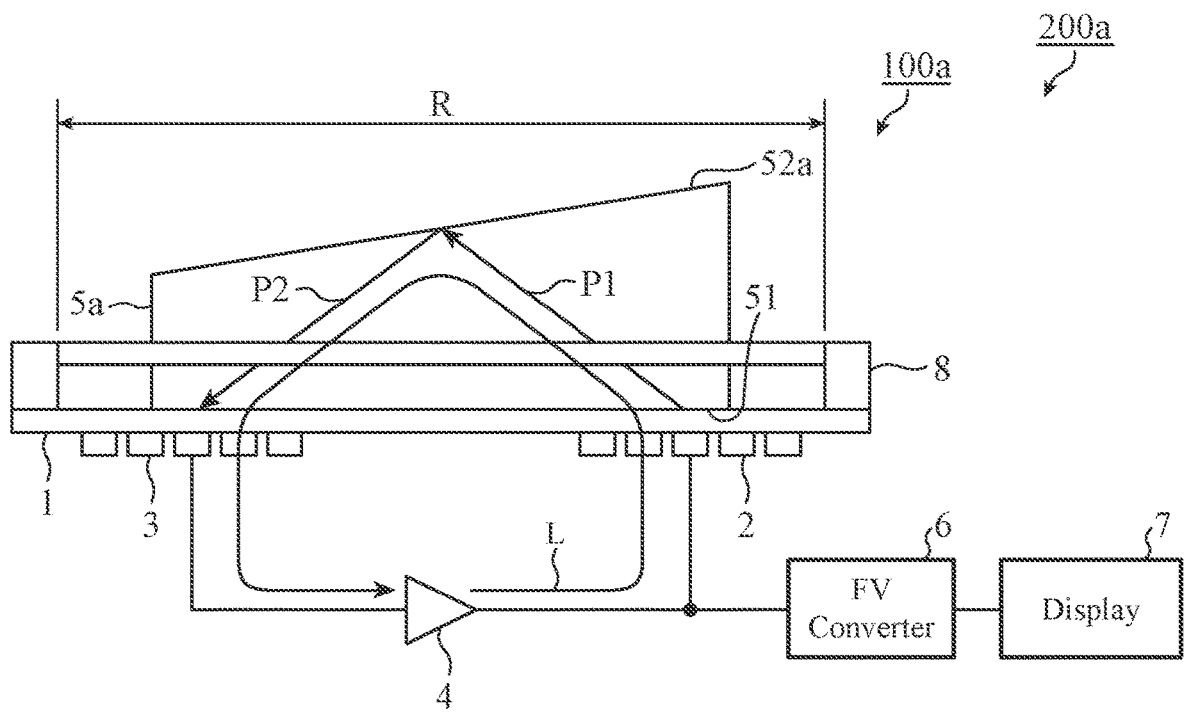
FIG. 4 is an explanatory drawing showing a main part of a vibration detection device including a vibration sensor according to Embodiment 2.

FIG. 4 is an explanatory drawing showing a main part of a vibration detection device including a vibration sensor according to Embodiment 2. The vibration detection device including the vibration sensor according to Embodiment 2 will be explained by reference to FIG. 4. In FIG. 4, the same structural components and the like as those shown in FIG. 1 are denoted by the same reference signs, and an explanation thereof will be omitted.

As shown in FIG. 4, the shape of a solid medium 5a is one in which a second surface part 52a is not parallel to a first surface part 51. More concretely, the shape of the solid medium 5a is one in which the second surface part 52a is inclined with respect to the first surface part 51.

Further, as shown in FIG. 4, a mechanism 8 for supporting the solid medium 5a in such a way that the solid medium can slide in a horizontal direction (referred to as a "slide supporting mechanism" hereinafter) is disposed. As a result, the solid medium 5a is configured so as to slide in response to a vibration of a target substance when the target substance vibrates in a horizontal direction (a so-called "slide vibration") in a state in which the target substance is in contact with the second surface part 52a. In the figure, R shows a range in which slide movement of the solid medium 5a are possible (referred to as a "slide movement range" hereinafter).

For example, in the case in which the target substance is a solid substance, the solid medium 5a vibrates integrally with the target substance because of either a frictional force or a pushdown pressure between the target substance and the second surface part 52a. As an alternative, for example, in the case in which the target substance is a solid substance, by providing fixing between the target substance and the solid medium 5a using a member for fixing, or the like, the solid medium 5a vibrates integrally with the target substance. Instead, for example, in the case in which the target substance is a liquid substance or a gas substance, by disposing a part of the solid medium 5a including at least the second surface part 52a in the target substance, the solid medium 5a vibrates integrally with the target substance. In this way, the solid medium 5a slides in response to a vibration of the target substance.

A main part of the vibration sensor 100a is constituted by a piezoelectric substrate 1, a first electrode 2, a second electrode 3, an amplifier 4, the solid medium 5a, and the slide supporting mechanism 8. The main part of the vibration detection device 200a is constituted by the vibration sensor 100a, an FV converter 6, and a display 7.

Next, a method of detecting a vibration by the vibration detection device 200a will be explained by reference to FIG. 5. More concretely, a method of detecting a vibration including at least a vibration component in a horizontal direction (referred to as a "horizontal vibration" hereinafter) will be explained.

As shown in FIG. 5, when a target substance O vibrates in a horizontal direction in a state in which the target substance O is in contact with the second surface part 52a, the solid medium 5a slides in response to the horizontal vibration of the target substance O. In the figure, D3 and D4 show the movement directions of the target substance O resulting from the horizontal vibration. More specifically, D3 and D4 show the vibration directions of the target substance O. Further, D3 and D4 show the movement directions of the solid medium 5a resulting from the slide movement.

At this time, because the second surface part 52a is not parallel to the first surface part 51, the lengths of propagation paths of a first ultrasonic wave and a second ultrasonic wave vary as a result of slide movement of the solid medium 5a. More specifically, the path lengths of the propagation paths P1 and P2 in the solid medium 5a vary.

Figure 5A:
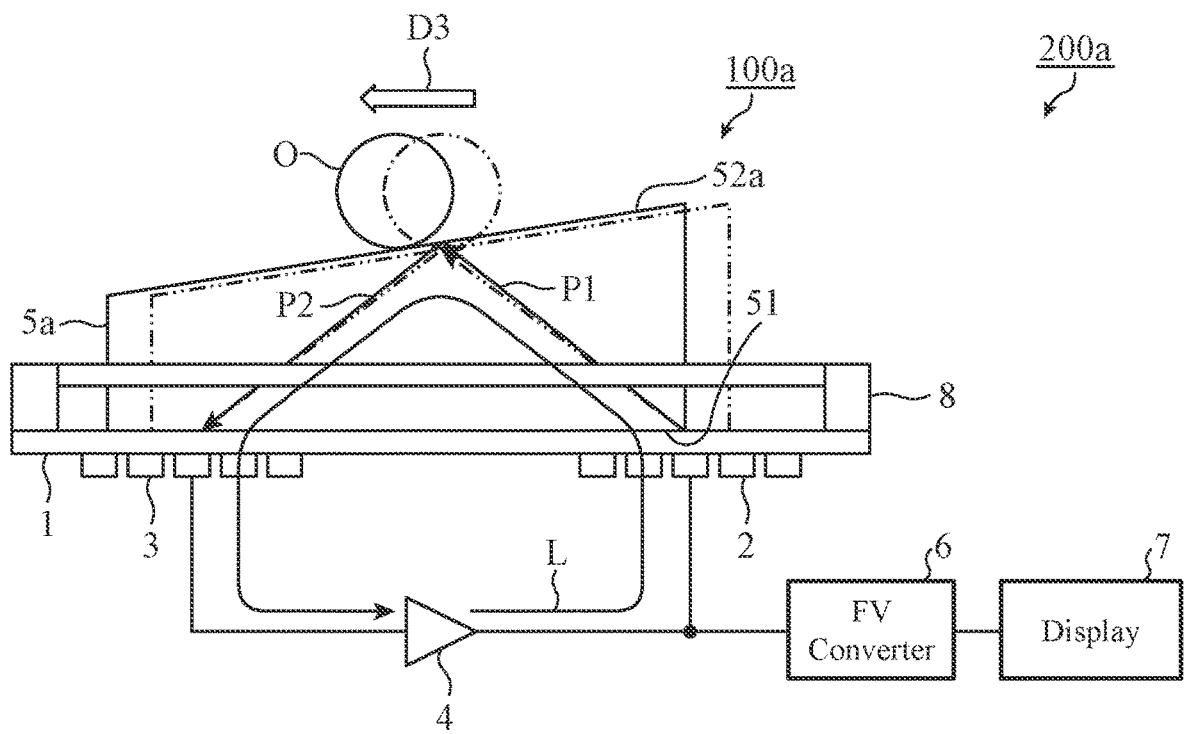
FIG. 5A is an explanatory drawing showing an example of a state in which the length of an oscillation loop varies as a result of slide movement of a solid medium in response to a horizontal vibration of a target substance.

More concretely, the path lengths of the propagation paths P1 and P2 become long because of a movement of the solid medium 5a in one direction D3 of the directions D3 and D4 (refer to FIG. 5A). The length of an oscillation loop becomes long because of the increase in the path lengths of the propagation paths P1 and P2. The frequency F becomes low because of the increase in the oscillation loop length.

Figure 5B:
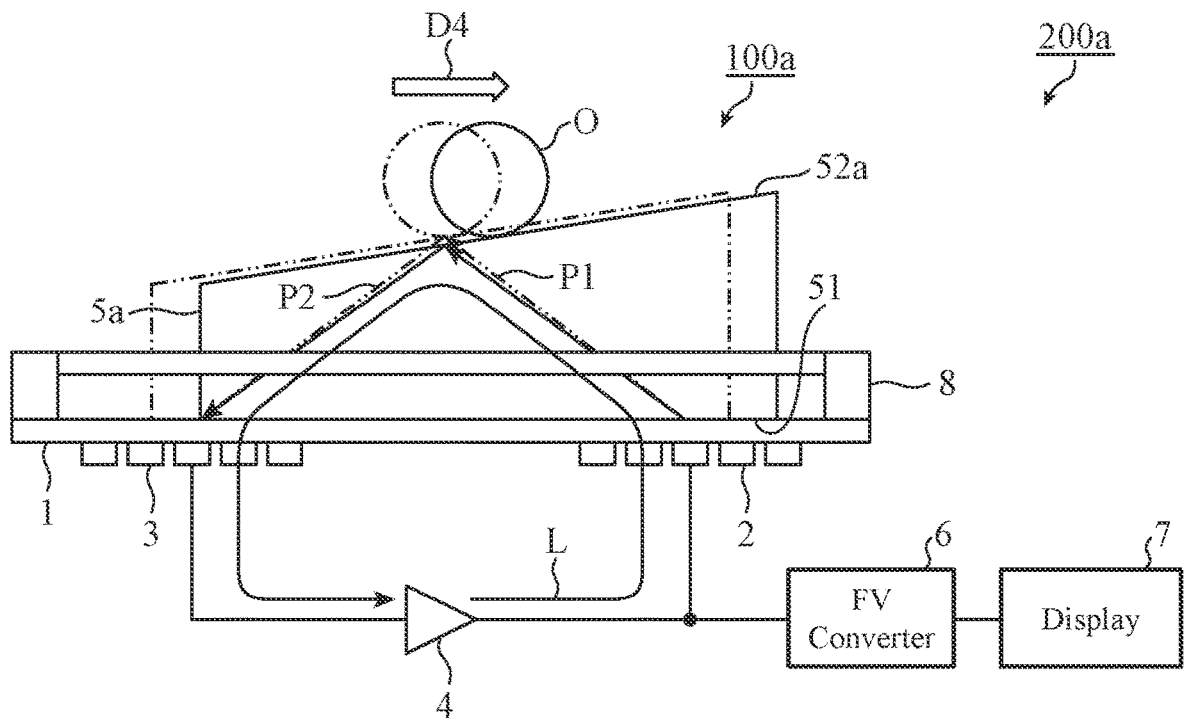
FIG. 5B is an explanatory drawing showing an example of the state in which the oscillation loop length varies as a result of slide movement of the solid medium in response to a horizontal vibration of the target substance.

Further, the path lengths of the propagation paths P1 and P2 become short because of a movement of the solid medium 5a in the other direction D4 of the directions D3 and D4 (refer to FIG. 5B). The oscillation loop length becomes short because of the decrease in the path lengths of the propagation paths P1 and P2. The frequency F becomes high because of the decrease in the oscillation loop length.

In this way, the oscillation loop length varies as a result of slide movement of the solid medium 5a in response to a horizontal vibration of the target substance O. As a result, the vibration detection device 200a can detect the horizontal vibration of the target substance O.

Next, an experimental result of a voltage waveform in the case of using the solid medium 5a made of polysulfone will be explained by reference to FIG. 6.

Figure 6:
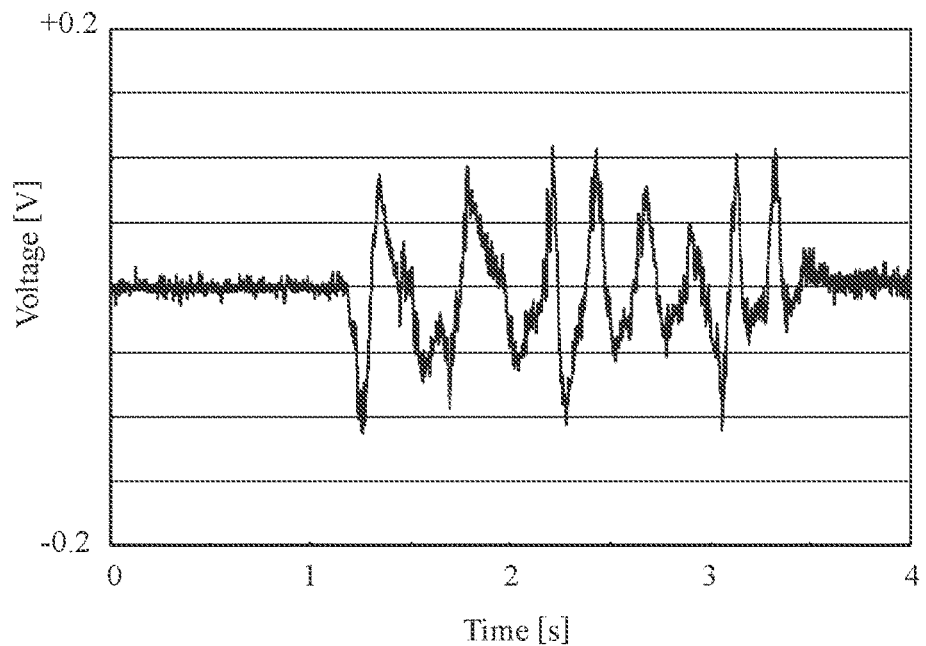
FIG. 6 is a characteristic diagram showing an experimental result of a voltage waveform when the solid medium vibrates in a horizontal direction.

FIG. 6 shows an experimental result of the voltage waveform when the solid medium 5a made of polysulfone vibrates in a horizontal direction in a cycle of several hertz by making slide movement. As shown in FIG. 6, when the solid medium 5a vibrates in a horizontal direction, the voltage waveform corresponding to the horizontal vibration is displayed on the display 7.

The vibration detection device 200a may detect a vertical vibration of the target substance, in addition to detecting a horizontal vibration of the target substance. More specifically, when the target substance vibrates in a vertical direction in a state in which the target substance is in contact with the second surface part 52a of the solid medium 5a, the vertical vibration of the target substance may be detected as a result of deformation of the solid medium 5a in response to the vertical vibration of the target substance.

Further, the material of the solid medium 5a is not limited to polysulfone. The material of the solid medium 5a only needs to have a sound speed lower than the phase speed of a plate wave propagating through the piezoelectric substrate 1.

Further, the shape of the solid medium 5a only needs to be one in which the second surface part 52a is not parallel to the first surface part 51, and is not limited to the concrete example shown in FIGS. 4 and 5. In Embodiment 3 which will be mentioned later, a vibration sensor 100b using a solid medium 5b having a shape different from that of the solid medium 5a will be explained.

In addition, in the vibration detection device 200a, the same various variants as those explained in Embodiment 1 can be adopted.

As mentioned above, in the vibration sensor 100a of Embodiment 2, the solid medium 5a has a shape in which the second surface part 52a is not parallel to the first surface part 51, and the slide supporting mechanism 8 for supporting the solid medium 5a in such a way that the solid medium can slide in a horizontal direction is provided, and a horizontal vibration of the target substance is detected as a result of slide movement of the solid medium 5a in response to the horizontal vibration. As a result, a horizontal vibration of the target substance can be detected on the basis of a variation of the oscillation loop length.

Further, in the vibration sensor 100a, the solid medium 5a has a shape in which the second surface part 52a is not parallel to the first surface part 51, and the slide supporting mechanism 8 for supporting the solid medium 5a in such a way that the solid medium can slide in a horizontal direction is provided, and a vertical vibration of the target substance is detected as a result of deformation of the solid medium 5a in response to the vertical vibration, and a horizontal vibration of the target substance is detected as a result of slide movement of the solid medium 5a in response to the horizontal vibration. As a result, on the basis of variations of the oscillation loop length, not only a horizontal vibration of the target substance but also a vertical vibration of the target substance can be detected.

Embodiment 3

Figure 7:
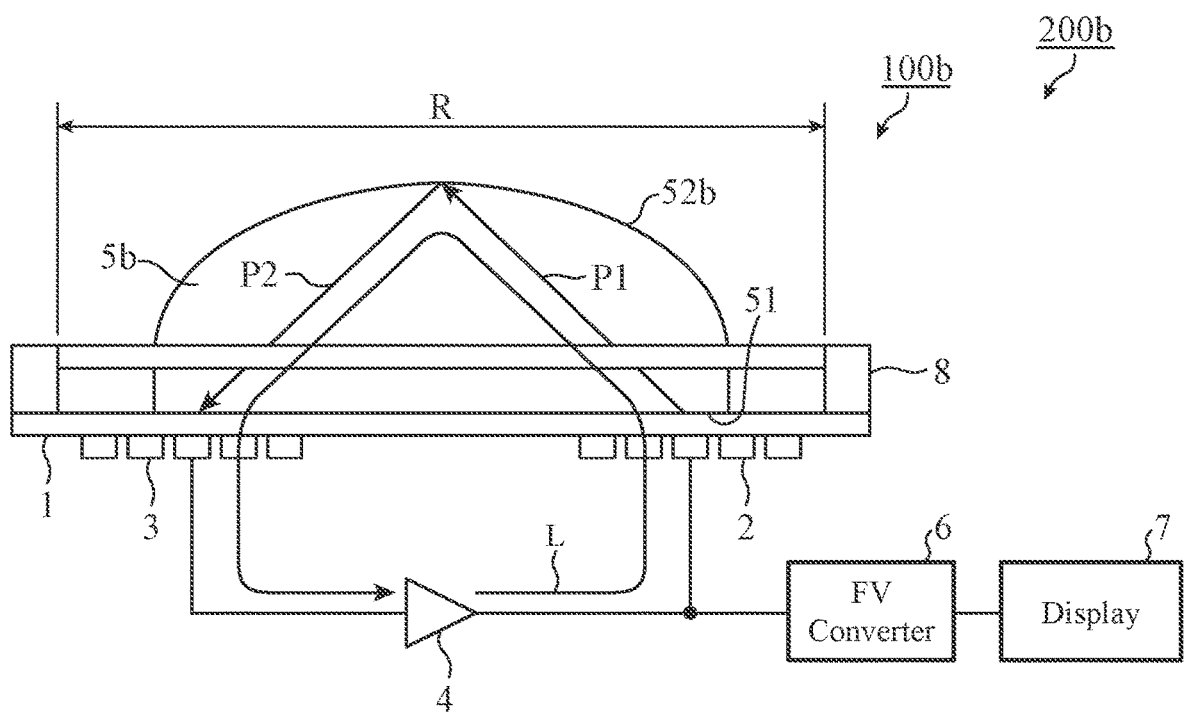
FIG. 7 is an explanatory drawing showing a main part of a vibration detection device including a vibration sensor according to Embodiment 3.

FIG. 7 is an explanatory drawing showing a main part of a vibration detection device including a vibration sensor according to Embodiment 3. The vibration detection device including the vibration sensor according to Embodiment 3 will be explained by reference to FIG. 7. In FIG. 7, the same structural components and the like as those shown in FIG. 4 are denoted by the same reference signs, and an explanation thereof will be omitted.

As shown in FIG. 7, a solid medium 5b has the same shape as a so-called "planoconvex cylindrical lens" (referred to as a "planoconvex cylindrical shape" hereinafter). A first surface part 51 of the solid medium 5b is constituted by a flat surface part in the planoconvex cylindrical shape. Further, a second surface part 52b of the solid medium 5b is constituted by a cylindrical surface part in the planoconvex cylindrical shape. More specifically, while the first surface part 51 has a plane shape, the second surface part 52a has a cylindrical surface shape. As a result, the second surface parts 52b is not parallel to the first surface part 51.

A main part of the vibration sensor 100b is constituted by a piezoelectric substrate 1, a first electrode 2, a second electrode 3, an amplifier 4, the solid medium 5b, and a slide supporting mechanism 8. The main part of the vibration detection device 200b is constituted by the vibration sensor 100b, an FV converter 6, and a display 7.

As shown in FIG. 8, when a target substance O vibrates in a horizontal direction in a state in which the target substance O is in contact with the second surface part 52b, the solid medium 5b slides in response to the horizontal vibration of the target substance O. At this time, because the second surface part 52b is not parallel to the first surface part 51, the lengths of propagation paths of a first ultrasonic wave and a second ultrasonic wave vary as a result of slide movement of the solid medium 5b. More specifically, the path lengths of the propagation paths P1 and P2 in the solid medium 5b vary.

Figure 8A:
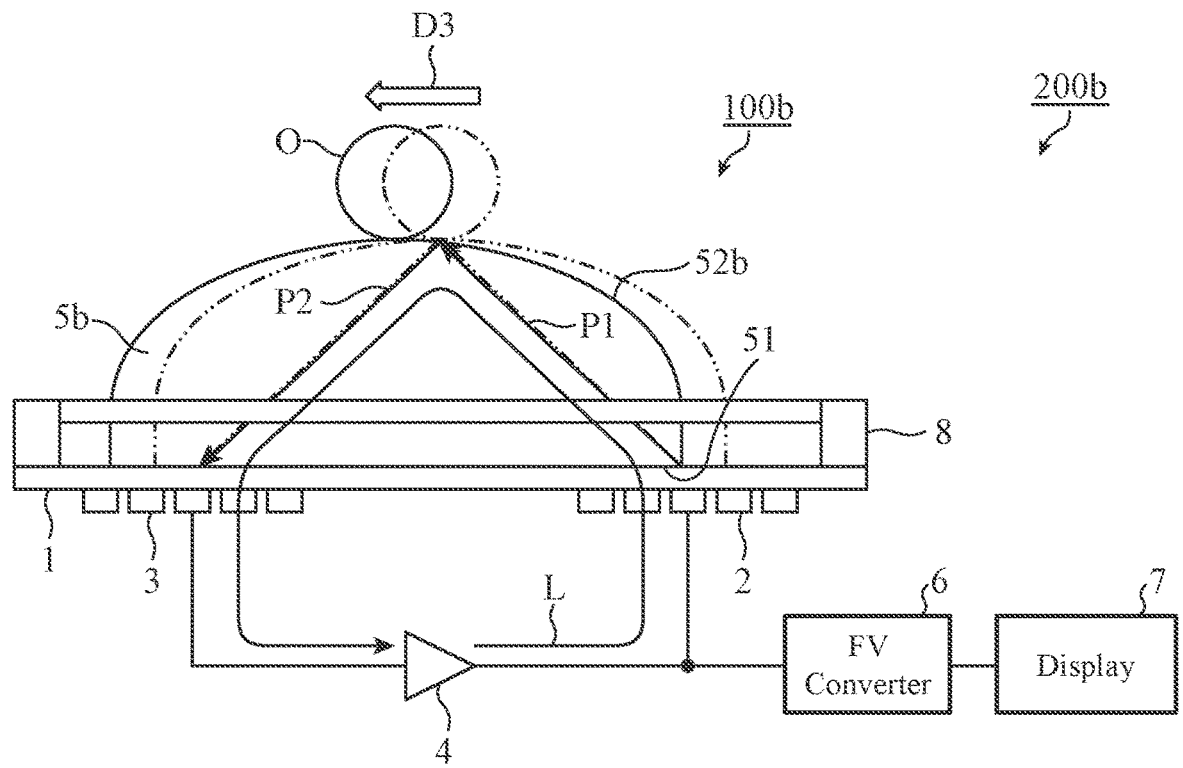
FIG. 8A is an explanatory drawing showing an example of a state in which the length of an oscillation loop varies as a result of slide movement of a solid medium in response to a horizontal vibration of a target substance.

More concretely, the path lengths of the propagation paths P1 and P2 become short, because of a movement of the solid medium 5b in one direction D3 of the directions D3 and D4 from a state in which the solid medium 5b is placed in a central part of a slide movement range R (refer to FIG. 8A). The length of an oscillation loop becomes short because of the decrease in the path lengths of the propagation paths P1 and P2. The frequency F becomes high because of the decrease in the oscillation loop length.

Figure 8B:
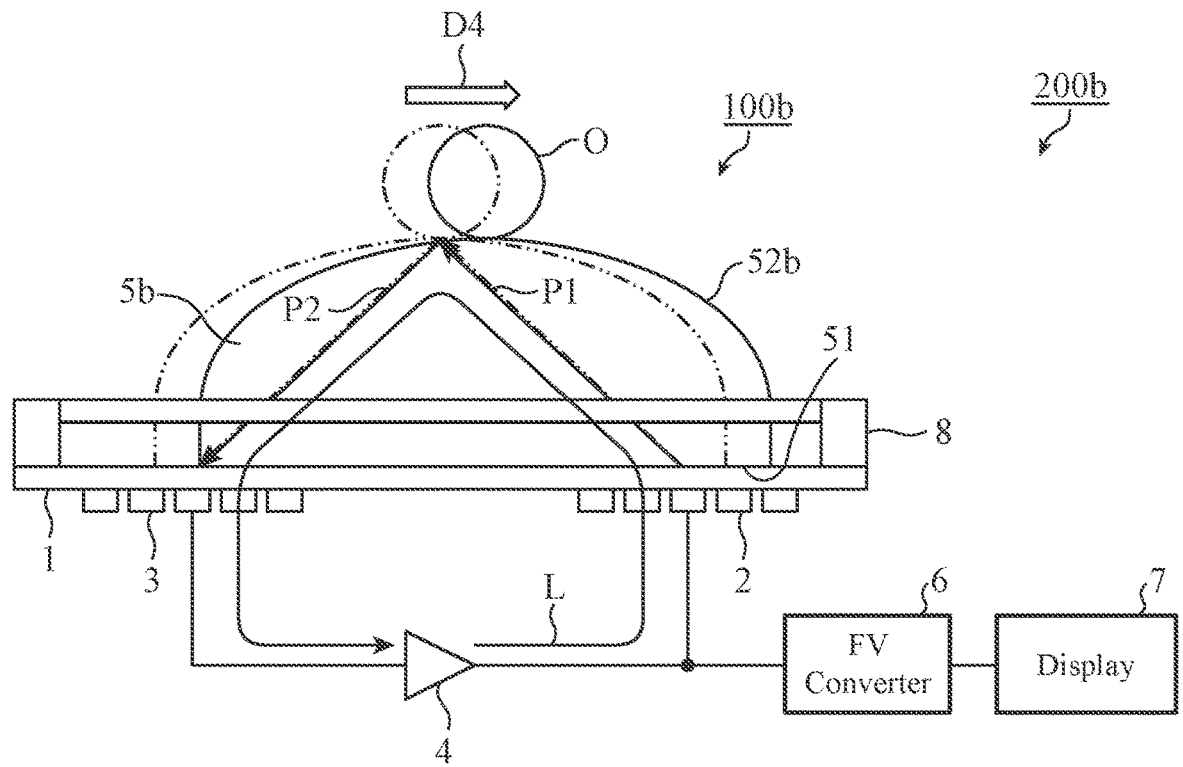
FIG. 8B is an explanatory drawing showing an example of the state in which the oscillation loop length varies as a result of slide movement of the solid medium in response to a horizontal vibration of the target substance.

Further, the path lengths of the propagation paths P1 and P2 become short, because of a movement of the solid medium 5b in the other direction D4 of the directions D3 and D4 from the state in which the solid medium 5b is placed in the central part of the slide movement range R (refer to FIG. 8B). The oscillation loop length becomes short because of the decrease in the path lengths of the propagation paths P1 and P2. The frequency F becomes high because of the decrease in the oscillation loop length.

In this way, the oscillation loop length varies as a result of slide movement of the solid medium 5b in response to a horizontal vibration of the target substance O. As a result, the vibration detection device 200b can detect the horizontal vibration of the target substance O.

The solid medium 5b may have the same shape as a so-called "planoconvex spherical lens" (referred to as a "planoconvex spherical surface shape" hereinafter). In this case, the first surface part 51 of the solid medium 5b is constituted by a flat surface part in the planoconvex spherical surface shape. Further, the second surface part 52b of the solid medium 5b is constituted by a spherical surface part in the planoconvex spherical surface shape. More specifically, while the first surface part 51 has a plane shape, the second surface part 52b has a spherical shape. As a result, in addition to the detection of a horizontal vibration in the directions D3 and D4 extending along the page in FIG. 8, the detection of a horizontal vibration in directions D5 and D6 (not illustrated) orthogonal to the page in FIG. 8 can be performed.

Further, the vibration detection device 200b may detect a vertical vibration of the target substance in addition to detecting a horizontal vibration of the target substance. More specifically, when the target substance vibrates in a vertical direction in a state in which the target substance is in contact with the second surface part 52b of the solid medium 5b, the vertical vibration of the target substance may be detected as a result of deformation of the solid medium 5b in response to the vertical vibration of the target substance.

In addition, in the vibration detection device 200b, the same various variants as those explained in Embodiment 1 can be adopted.

As mentioned above, in the vibration sensor 100b of Embodiment 3, the solid medium 5b has a shape in which the second surface part 52b is not parallel to the first surface part 51, and the slide supporting mechanism 8 for supporting the solid medium 5b in such a way that the solid medium can slide in a horizontal direction is provided, and the loop length (oscillation loop length) varies as a result of slide movement of the solid medium 5b in response to a horizontal vibration of the target substance. As a result, a horizontal vibration of the target substance can be detected on the basis of a variation of the oscillation loop length.

Further, in the vibration sensor 100b, the solid medium 5b has a shape in which the second surface part 52b is not parallel to the first surface part 51, and the slide supporting mechanism 8 for supporting the solid medium 5b in such a way that the solid medium can slide in a horizontal direction is provided, and the loop length (oscillation loop length) varies as a result of deformation of the solid medium 5b in response to a vertical vibration of the target substance, and the loop length (oscillation loop length) varies as a result of slide movement of the solid medium 5b in response to a horizontal vibration of the target substance. As a result, on the basis of variations of the oscillation loop length, not only a horizontal vibration of the target substance but also a vertical vibration of the target substance can be detected.

Further, the solid medium 5b has a planoconvex cylindrical shape, the first surface part 51 is constituted by a flat surface part in planoconvex cylindrical shape, and the second surface part 52b is constituted by a cylindrical surface part in the planoconvex cylindrical shape. As a result, a horizontal vibration in the directions D3 and D4 can be detected.

Further, the solid medium 5b has a planoconvex spherical surface shape, the first surface part 51 is constituted by a flat surface part in the planoconvex spherical surface shape, and the second surface part 52b is constituted by a spherical surface part in the planoconvex spherical surface shape. As a result, not only a horizontal vibration in the directions D3 and D4 but also a horizontal vibration in the directions D5 and D6 can be detected.

It is to be understood that any combination of the embodiments can be made, various changes can be made in any component in each of the embodiments, or any component in each of the embodiments can be omitted within the scope of the present invention.

INDUSTRIAL APPLICABILITY

The vibration sensor and the vibration detection device of the present invention can be used for detection of vibrations in, for example, various pieces of equipment.

REFERENCE SIGNS LIST 1 piezoelectric substrate, 2 first electrode, 3 second electrode, 4 amplifier, 5, 5a, 5b solid medium, 6 frequency-to-voltage converter (FV converter), 7 display, 8 slide supporting mechanism, 51 first surface part, 52, 52a, 52b second surface part, 100, 100a, 100b vibration sensor, and 200, 200a, 200b vibration detection device.

The invention claimed is:

1. A vibration sensor comprising:
a piezoelectric substrate;
a first electrode and a second electrode that are arranged on the piezoelectric substrate;
an amplifier electrically connected between the first electrode and the second electrode; and
a solid medium having a first surface part in contact with the piezoelectric substrate, and a second surface part disposed opposite to the first surface part and used for contact with a target substance, the solid medium having a sound speed lower than a phase speed of a plate wave in the piezoelectric substrate,
wherein an oscillation loop includes the piezoelectric substrate, the first electrode, the second electrode, the amplifier, and the solid medium, and a vibration of the target substance is detected as a result of variation in a loop length of the oscillation loop caused by a variation of a portion of the loop length of the oscillation loop that is a part of the solid medium, in response to the vibration of the target substance.

2. The vibration sensor according to claim 1, wherein the loop length varies as a result of deformation of the solid medium in response to a vertical vibration of the target substance.

3. The vibration sensor according to claim 1, wherein
the solid medium has a shape in which the second surface part is not parallel to the first surface part,
the vibration sensor includes a slide supporting mechanism to support the solid medium in such a way that the solid medium can slide in a horizontal direction, and
the loop length varies as a result of slide movement of the solid medium in response to a horizontal vibration of the target substance.

4. The vibration sensor according to claim 1, wherein
the solid medium has a shape in which the second surface part is not parallel to the first surface part,
the vibration sensor includes a slide supporting mechanism to support the solid medium in such a way that the solid medium can slide in a horizontal direction, and
the loop length varies as a result of deformation of the solid medium in response to a vertical vibration of the target substance, and the loop length varies as a result of slide movement of the solid medium in response to a horizontal vibration of the target substance.

5. The vibration sensor according to claim 3, wherein the solid medium has a planoconvex cylindrical shape, the first surface part is formed by a flat surface part in the planoconvex cylindrical shape, and the second surface part is formed by a cylindrical surface part in the planoconvex cylindrical shape.

6. The vibration sensor according to claim 4, wherein the solid medium has a planoconvex cylindrical shape, the first surface part is formed by a flat surface part in the planoconvex cylindrical shape, and the second surface part is formed by a cylindrical surface part in the planoconvex cylindrical shape.

7. The vibration sensor according to claim 3, wherein the solid medium has a planoconvex spherical surface shape, the first surface part is formed by a flat surface part in the planoconvex spherical surface shape, and the second surface part is formed by a spherical surface part in the planoconvex spherical surface shape.

8. The vibration sensor according to claim 4, wherein the solid medium has a planoconvex spherical surface shape, the first surface part is formed by a flat surface part in the planoconvex spherical surface shape, and the second surface part is formed by a spherical surface part in the planoconvex spherical surface shape.

9. The vibration sensor according to claim 1, wherein the solid medium is made of polysulfone.

10. The vibration sensor according to claim 1, wherein the target substance is part of equipment to be a target for maintenance work.

11. A vibration detection device comprising:
the vibration sensor according to claim 1;
a frequency-to-voltage converter to convert a frequency corresponding to the loop length into a voltage; and
a display to display a screen including a waveform showing the voltage with respect to time.

* * * * *